(12) United States Patent
Zhou

(10) Patent No.: US 7,050,675 B2
(45) Date of Patent: *May 23, 2006

(54) INTEGRATED OPTICAL MULTIPLEXER AND DEMULTIPLEXER FOR WAVELENGTH DIVISION TRANSMISSION OF INFORMATION

(75) Inventor: Zhiping (James) Zhou, Marietta, GA (US)

(73) Assignee: Advanced Interfaces, LLC, Atlanta, GA (US)

( * ) Notice: Subject to any disclaimer, the term of this patent is extended or adjusted under 35 U.S.C. 154(b) by 186 days.

This patent is subject to a terminal disclaimer.

(21) Appl. No.: 10/767,121

(22) Filed: Jan. 29, 2004

(65) Prior Publication Data

US 2004/0184732 A1    Sep. 23, 2004

Related U.S. Application Data

(63) Continuation-in-part of application No. 10/281,790, filed on Oct. 28, 2002, now Pat. No. 6,718,093, which is a continuation of application No. 09/722,989, filed on Nov. 27, 2000, now Pat. No. 6,490,393.

(51) Int. Cl.
   *G02B 6/34* (2006.01)
(52) U.S. Cl. .............................. 385/37; 385/14; 385/24
(58) Field of Classification Search ................... 385/14, 385/24, 37
   See application file for complete search history.

(56) References Cited

U.S. PATENT DOCUMENTS

| | | |
|---|---|---|
| 4,011,009 A | 3/1977 | Lama et al. |
| 4,335,933 A | 6/1982 | Palmer |
| 4,343,532 A | 8/1982 | Palmer |
| 4,484,072 A | 11/1984 | Matsumura |
| 4,760,569 A | 7/1988 | Mahlein |
| 4,763,969 A | 8/1988 | Khoe et al. |

(Continued)

FOREIGN PATENT DOCUMENTS

EP    0347563    12/1989

(Continued)

OTHER PUBLICATIONS

Haidner et al., "Dielectric Binary Blazed Gratings", Applied Optics, Aug. 1993, vol. 32, No. 22, pp. 4276-7278.

(Continued)

*Primary Examiner*—Michelle Connelly-Cushwa
(74) *Attorney, Agent, or Firm*—Womble Carlyle Sandridge & Rice, PLLC

(57) ABSTRACT

A multiplexer/demultiplexer is provided for optical interconnection between electronic components on an integrated circuit chip. The multiplexer/demultiplexer includes a substrate formed with an array of photo emitters/detectors and conditioning electronics coupled thereto. A first layer of optically transparent material is formed on the substrate overlying the emitters/detectors and a second layer of optically transparent material, functioning as an optical waveguide, is formed on the first layer. A binary blazed grating is formed at the interface of the two layers. For multiplexing, discrete wavelength optical signals are modulated with data, emitted by the emitters, intercepted by the binary blazed grating, and multiplexed into a polychromatic beam for transmission through the waveguide. For demultiplexing, the discrete wavelengths are separated by the binary blazed grating and directed to corresponding detectors. The conditioning electronics receive and demodulate the output of the detectors to extract data, and format the data for communication with electronic components.

38 Claims, 5 Drawing Sheets

U.S. PATENT DOCUMENTS

| | | |
|---|---|---|
| 4,923,271 A | 5/1990 | Henry et al. |
| 4,994,664 A | 2/1991 | Veldkamp |
| 5,033,816 A | 7/1991 | Blondeau et al. |
| 5,070,488 A | 12/1991 | Fukushima et al. |
| 5,074,646 A | 12/1991 | Huang et al. |
| 5,099,114 A | 3/1992 | Matsumoto et al. |
| 5,113,067 A | 5/1992 | Nakai et al. |
| 5,119,454 A | 6/1992 | McMahon |
| 5,223,703 A | 6/1993 | Setani |
| 5,276,745 A | 1/1994 | Revelli, Jr. |
| 5,345,444 A | 9/1994 | Cloonan et al. |
| 5,362,957 A | 11/1994 | Nakai et al. |
| 5,377,044 A | 12/1994 | Tomono et al. |
| 5,434,426 A | 7/1995 | Furuyama et al. |
| 5,457,760 A | 10/1995 | Mizrahi |
| 5,481,381 A | 1/1996 | Fujimoto |
| 5,506,676 A | 4/1996 | Hendler et al. |
| 5,559,912 A | 9/1996 | Agahi et al. |
| 5,566,024 A | 10/1996 | Rauch |
| 5,568,574 A | 10/1996 | Tanguay, Jr. et al. |
| 5,615,024 A | 3/1997 | May et al. |
| 5,682,266 A | 10/1997 | Meyers |
| 5,684,308 A | 11/1997 | Lovejoy et al. |
| 5,730,888 A | 3/1998 | Byron |
| 5,731,874 A | 3/1998 | Maluf |
| 5,740,292 A | 4/1998 | Strasser |
| 5,742,433 A | 4/1998 | Shiono et al. |
| 5,760,937 A | 6/1998 | Ishikawa et al. |
| 5,818,986 A | 10/1998 | Asawa et al. |
| 5,825,520 A | 10/1998 | Huber |
| 5,856,961 A | 1/1999 | Brazas et al. |
| 5,959,747 A | 9/1999 | Psaltis et al. |
| 5,963,684 A | 10/1999 | Ford et al. |
| 6,011,884 A | 1/2000 | Dueck et al. |
| 6,011,885 A | 1/2000 | Dempewolf et al. |
| 6,118,561 A | 9/2000 | Maki |
| 6,198,864 B1 | 3/2001 | Lemoff et al. |
| 2002/0041734 A1 | 4/2002 | Worchesky et al. |

FOREIGN PATENT DOCUMENTS

| | | |
|---|---|---|
| WO | WO 0242821 | 5/2002 |

OTHER PUBLICATIONS

Farn, "Binary Gratings With Increased Efficiency", Applied Optics, Aug. 1992, Vo. 31, No. 22, pp. 4453-4458.

Advertisement from Applied Optics; Optical Society of America entitled "Dielectric Binary Blazed Gratings", Aug. 1, 1993.

Advertisement from Applied Optics, Optical Society of America entitled "Binary Gratings With Increased Efficiency", Aug. 1, 1992.

INTEGRATED OPTICAL MULTIPLEXER AND DEMULTIPLEXER FOR WAVELENGTH DIVISION TRANSMISSION OF INFORMATION

CROSS REFERENCE TO RELATED APPLICATIONS

This is a continuation-in-part of application Ser. No. 10/281,790, filed on Oct. 28, 2002, now U.S. Pat. No. 6,718,093, which is a continuation of application Ser. No. 09/722,989, filed on Nov. 27, 2000, now U.S. Pat. No. 6,490,393.

FIELD OF THE INVENTION

This invention relates generally to wavelength division optical transmission of information and more particularly to wavelength division optical multiplexers and demultiplexers for use in optical transmission systems.

BACKGROUND

Wavelength division multiplexing (WDM) is a valuable technique for increasing the information carrying capacity of optical transmissions for voice communications as well as high density transmission of data. In essence, WDM involves modulating light beams of multiple discrete wavelengths with information to be transmitted, combining or multiplexing the beams into a single polychromatic light beam, and transmitting the polychromatic beam to a receiving location by means, for example, of optical fibers or waveguides. At the receiving location, the beam is demultiplexed or separated back into its component discrete wavelength beams, each of which may then be demodulated to extract the information carried by the beam. Thus, many channels of information can be transmitted simultaneously thereby multiplying the information carrying capacity of the transmission.

Wavelength division optical transmission requires an optical multiplexer for combining individual optical signals into a multiplexed signal and an optical demultiplexer for separating the multiplexed signal back into its discrete wavelength components. A variety of optical multiplexers and demultiplexers have been developed for this purpose, many of which are for use in the telecommunications industry. Some of these devices make use of optical gratings because such gratings inherently diffract and/or reflect light beams of different wavelengths at different angles. For example, U.S. Pat. No. 6,011,884 of Dueck et al. discloses an optical wavelength division multiplexer that integrates an axial gradient refractive index element with a diffraction grating. Enhanced efficiency multiplexing of discrete wavelength optical beams into a single polychromatic beam for transmission is asserted. U.S. Pat. No. 4,923,271 of Henry et al. discloses an optical multiplexer/demultiplexer having a plurality of focusing Bragg reflectors, each including a plurality of confocal elliptical grating lines. U.S. Pat. No. 5,818,986 of Asawa et al. discloses an optical wavelength demultiplexer incorporating angular back reflection from a series of Bragg gratings in the optical signal path to separate a polychromatic optical beam into its constituent wavelengths. Devices such as these generally are used in the telecommunications industry for the transmission of voice and similar signals over optical communications networks. The size of such devices generally is not an issue in the telecommunications industry and, thus, optical multiplexers and demultiplexers such as those disclosed in the above patents and others tend to be relatively large and bulky.

The past four decades have been a time during which microelectronics, including the integrated circuit chip, has advanced at exponential rates. Microelectronics has entered into almost all aspects of human life through the invention of small electronic devices such as watches, hearing aids, implantable cardiac pacemakers, pocket calculators, and personal computers. The advance of microelectronics has become the principal driving force of innovation in modern information technologies and high-density data communications such as fiber communications, global satellite communications, cellular phones, the Internet, and the World Wide Web. As microelectronics techniques advance, nanoelectronics (feature scales on the order of $10^{-9}$ meters) are being realized.

Based on the current growth rate of data communication traffic, the microelectronic chip of 2010 likely will be an array of parallel processors consisting of at least 1024 channels with processing speeds of 40 Gigabytes per second (Gb/s) or faster for each channel. This pushes semiconductor technology towards gigascale and terascale integration with smaller component or feature sizes and larger chip sizes. At the same time, interconnections between circuit components on the chip must support the data transfer rates of 40 Gb/s or faster. As integrated circuit feature sizes continue to decrease and chip sizes continue to increase, interconnections formed of conventional electrical interconnects and switching technology are rapidly becoming a critical issue in the realization of microelectronic systems. It is believed that the maximum length of interconnection required for a chip is proportional to one half of the square root of the chip area. This parameter thus will be approximately constant while the circuit feature size and required interconnection data throughput scales down. As a consequence, the interconnection delay will be kept approximately constant while device delay is reduced as feature sizes are scaled down. The interconnection delay can even increase if chip size is scaled up. At some point in this scaling process, interconnection delay will dominate system speed; i.e., system speed will not be able to track increasing device speed performance due to the interconnection delay. Conventional conductor and semiconductor interconnects are not able to sustain the required future data rates of 40 Gb/s or higher. Thus conventional interconnects between features on future chips will be an insurmountable bottleneck to the throughput of high-density data communication systems and will be unworkable in future high-speed microelectronics.

To handle the unprecedented growth of data and telecommunications traffic, many novel transmission mechanisms have been proposed, including 3D structures with multiple levels of transistors and conventional interconnects, wireless RF interconnections using co-planar waveguides and capacitive couplers to obtain a "micro-area network on a chip," and on chip optical interconnections. Of these proposals, optical interconnections, which has proven itself in large scale telecommunications networks, appears to hold the most promise. This is due to a number of factors including the fact that the propagation speed of an optical signal is independent of the number of electronic components that receive the signal, the fact that optical interconnections do not suffer mutual interference effects, and that optical interconnect paths can cross each other without significant interaction. As a result, optical interconnections between microchip features promises to enhance communication performance by providing larger fan-outs at higher bandwidths.

There are two major challenges to the introduction of optical interconnections to microelectronic data communication systems such as computer chips. First, the optical systems and the electronic systems have different architectures since they operate under different physical principals. Second, optical component technology on a micro- or nano-optical scale necessary for implementation of on-chip optical interconnects is not mature and it is costly. Thus, the key to successful application of optical interconnections to high-density microelectronic systems is to perform very effective integration of exceedingly small but highly efficient optical devices with increasingly smaller microelectronic circuitry components.

In order to maximize the potential of micro-optical interconnects for data communications, wavelength division multiplexing of multiple optical signals on a micro- or nano-scale will be employed just as it has been on a macro scale in the telecommunications industry. This requirement calls for exceedingly small optical multiplexers and demultiplexers for combining and separating discrete wavelength optical signals. Further, due to power and heat dissipation constraints present in a microelectronic circuit environment, these micro-optical multiplexers and demultiplexers must operate with virtually no optical transmission losses, otherwise the data throughput will be compromised. Finally, the micro-optical multiplexers and demultiplexers must be highly integrated with micro-optical transmitters for generating the optical signals to be multiplexed and transmitted and with micro-optical sensors or detectors for receiving demultiplexed optical signals. In addition, related interface circuitry will be required for transforming electronic signals from microcircuit components into optical signals and vice versa for integrating optical interconnection components with electronic CMOS microcircuit components, all on a micro- or nano-scale.

One type of optical diffraction grating capable of separating a multiplexed polychromatic optical signal into its constituent component beams with virtually no transmission loss is known as a blazed grating. Blazed gratings on a macroscopic scale are known and need not be described in detail here. U.S. Pat. No. 4,359,373 of Hammer, and U.S. Pat. No. 5,279,924 of Sakai et al. disclose and discuss blazed gratings in substantial detail and their disclosures are hereby incorporated fully by reference. Generally, however, a blazed grating is a type of diffraction grating characterized by an asymmetric groove structure wherein adjacent ridges are substantially triangular in cross section, forming an array of microprisms. Blazed gratings are extremely efficient and can be designed to divert or allocate nearly 100% of the power of an incident optical beam into a single diffracted order such as, for example, the +1 order. When an incident beam is a multiplexed polychromatic beam, each discrete wavelength component beam within the incident beam is diffracted at a different angle and thus the component beams are fanned out and separated, resulting in demultiplexing of the incident beam. Optical sensors can be positioned to intercept the discrete beams for detection and demodulation of data they carry. Since nearly 100% of the incident power is preserved by the blazed grating, the demultiplexing is accomplished with virtually no transmission loss, which translates to higher data throughput with an optical signal of a given power.

While blazed gratings have potential as highly efficient, compact, planar demultiplexers and waveguide couplers, they carry significant inherent problems in that the continuously varying profile of the microprism ridges are difficult and expensive to fabricate. Fabrication becomes an increasing problem as the size and scale of the grating is reduced until, at some threshold, known fabrication techniques such as ion beam etching simply are ineffective to produce the grating. At the micro- or nano-scales required for integrated micro-optical interconnections, no known fabrication technique is available.

Even if exceedingly small scale blazed gratings could be fabricated, there still is an inherent and inescapable practical lower limit to their size for demultiplexing applications. More specifically, as the period of the grating elements in a blazed grating becomes smaller and approaches the wavelength of the incident light, the blazed grating progressively becomes a so-called zero order grating. In other words, when the grating period is extremely small, and certainly when it is smaller than the wavelength of the incident light, i.e. when the period is sub-wavelength, a regular blazed grating allocates all of the transmitted light to the zero diffractive order rather than to the first or higher orders. Under such conditions, an incident light beam is not diffracted as it traverses the grating but, instead, passes straight through the grating regardless of its wavelength. However, optical demultiplexing fundamentally requires that light of different wavelengths be diffracted or fanned-out at different angles by a grating so that they are separated. Since a zero order grating passes each wavelength straight through, the different wavelengths are not separated and there is no separating or demultiplexing of a polychromatic optical signal. Thus, regular blazed gratings simply are not functional as optical demultiplexers on the micro- or nano-scale necessary for use in microelectronics data interconnections.

Accordingly, even though regular blazed gratings on a macro scale theoretically offer the performance characteristics necessary for use in integrated micro-optical interconnections, they are in fact not suitable for such applications for a variety of reasons as discussed above.

The performance characteristics of regular blazed gratings can be approached by so-called multi-level gratings wherein the continuously varying sloped surfaces of the grating elements of a regular blazed grating are simulated with multiple discrete surface levels or steps. According to theory, a multi-level grating with 16 levels or steps per grating element can deflect 99% of input beam power to a designated diffractive order. Such a multi-level grating is disclosed in U.S. Pat. No. 5,742,433 of Shiono et al. One problem with multi-level gratings is that multi-step fabrication techniques are required for their manufacture with the number of steps being proportional to the number of levels in the grating features. As a result, the critical alignment of the various levels of each grating element is exceedingly difficult to maintain, especially on the sub-wavelength scales required for microcircuit interconnections. Accordingly, multi-level gratings are not a practical solution to the problems with regular blazed gratings.

Binary blazed gratings have been developed as another alternative to regular blazed gratings. Essentially, a binary blazed grating is a grating in which the grating ridges are all at a single level and the grating troughs are at a single level (i.e. two steps), but the ridge width, trough width, and/or spacing between grating elements varies to create localized subwavelength, submicrometer grating features within the grating period. Fundamental research on the design and optimization of binary blazed gratings has been conducted by the inventor of the present invention and others. This research is presented in Z. Zhou and T. J. Drabik, *Optimized Binary, Phase-only, Diffractive Element with Subwavelength Features for 1.55 μm*, J. Opt. Soc. Am. A/Vol. 12, No. 5/May 1995; and Z. Zhou and N. Hartman, *Binary Blazed Grating*

*for High Efficient Waveguide Coupling*, SPIE Vol. 2891, 1996. The theory and optimization of a binary blazed grating as an alternative to a regular or linear blazed grating is presented in substantial detail in these papers and thus need not be repeated here. Instead, the disclosures of these papers are hereby incorporated by reference as if fully set forth herein.

Binary blazed gratings have been shown to exhibit transmission efficiencies when diffracting light into the first or higher diffractive orders that approaches that of a regular blazed grating. However, binary blazed gratings have several inherent advantages both over regular or linear blazed gratings and over multi-level gratings. Specifically, the subwavelength grating features of a binary blazed grating can be fabricated relatively easily and in a single step with existing fabrication techniques. Further, and most significantly for the present invention, binary blazed gratings do not become zero order gratings at subwavelength scales as do regular blazed gratings. In other words, a binary blazed grating continues to allocate a very high percentage of the power of an incident light beam into the first or a higher diffractive order, even when the grating elements are smaller than the wavelength of the incident beam.

In view of the foregoing, it will be seen that a need exists for an integrated optical multiplexer and demultiplexer for use in wavelength division transmission of information that is downwardly scalable to be incorporated into microelectronic devices as optical interconnections between electronic components. The integration should include signal conditioning circuitry for converting transmitted information between the optical and electronic domains for integration with CMOS circuit components. Further, the multiplexing and demultiplexing functions should be performed with near perfect transmission efficiency similar to that obtainable on a macro scale with a regular blazed grating to preserve optical power, minimize heat generation, and maximize information throughput. It is to the provision of such a device that the present invention is primarily directed.

SUMMARY OF THE INVENTION

Briefly described, the present invention, in a preferred embodiment thereof, comprises an integrated optical demultiplexer (which also can be configured as a multiplexer) for use in wavelength division transmission of information. All of the components of the demultiplexer are formed and integrated on an integrated chip substrate and can be scaled to micro- or nano-scales for use as optical data interconnects between electronic elements of a computer chip such as a microprocessor. In fact, the present invention is uniquely suited for use in nano-electronic circuits. In one embodiment, the integrated optical demultiplexer comprises an integrated circuit substrate, which can be a traditional silicon substrate. An array of optical photo detectors are formed on the substrate using standard integrated circuit etching and doping techniques. Signal conditioning electronics are formed on the substrate and are coupled to receive electrical signals from the photo detectors when they are exposed to light. The signal conditioning electronics are designed to demodulate signals from the photo detectors to extract data from incident light beams on the photo detectors and to convert the data to a format for communication with electronic components.

A first layer of optically transparent material having a first index of refraction is formed on the substrate overlying the photo detectors. A second layer of optically transparent material having a second index of refraction is formed on and overlies the first layer of optically transparent material defining an interface between the two layers of optically transparent material overlying the photo detectors. A binary blazed grating is formed at the interface between the first and second layers of optically transparent material. With this configuration, the second layer of optically transparent material forms an optical waveguide through which light signals can propagate from one place to another. The binary blazed grating forms a waveguide coupler between the waveguide formed by the second layer of optically transparent material and the first layer of optically transparent material, which overlies the array of photo detectors.

In use, a wavelength division multiplexed light beam made up of several discrete wavelength beams each modulated with data to be transmitted is introduced into the optical waveguide formed by the second layer of optically transparent material. Alternatively, such a beam may be introduced into the waveguide directly from another layer overlying the waveguide. This overlying layer may be free space (index of refraction approximately equal to 1) or it may be an optically transparent material with an index of refraction less than that of the waveguide material. In any event (i.e. whether the multiplexed beam is transmitted through the waveguide or arrives from outside the waveguide), when the multiplexed beam encounters the binary blazed grating, the discrete wavelength beams are diffracted by the grating at different angles that are functions of their respective wavelengths. Thus, the multiplexed optical beam is demultiplexed by the binary blazed grating and the discrete wavelength beams are fanned out.

The photo detectors underlying the binary blazed grating beneath the first layer of optically transparent material are positioned such that each photo detector intercepts one of the discrete wavelength beams from the grating. The conditioning electronics coupled to the array of photo detectors receives the resulting signals from the photo detectors, demodulates the signals to extract the data originally encoded into the light beam, and formats the data in an appropriate form for communication with electronic components on the integrated circuit.

Since optics is reversible, the invention also contemplates an optical multiplexer for multiplexing discrete wavelength light beams modulated with data into a wavelength division multiplexed optical signal for transmission. In the multiplexer, the photo detectors are replaced with photo emitters for emitting the discrete wavelength light beams and the conditioning electronics functions to reformat data to be transmitted and modulate the data onto light beams emitted by the emitters. Thus, an on-chip micro- or nano-scale optical interconnection network for microelectronic chips is now possible through application of the present invention. The binary blazed grating of the invention can be fabricated on these scales in a one step process with existing fabrication techniques. More importantly, unlike a regular blazed grating, a binary blazed grating does not become a zero-order grating at the required sub-wavelength scales but instead continues to allocate almost all of the incident light into a selected diffractive order such as, for example, the +1 order. Thus, the diffraction and resultant demultiplexing of optical beams is preserved at the required small scales. Finally, since the binary blazed grating is extremely efficient in allocating incident light to the selected diffractive order, a higher intensity optical signal is transmitted to the photo detectors, which respond more quickly as a result. This results in faster data throughputs.

Accordingly, an integrated optical multiplexer and demultiplexer for wavelength division transmission of information resolves problems with the prior art and is downwardly scalable for use as optical interconnects between electronic components on an integrated circuit chip. These and other objects, features, and advantages of the invention will become more apparent upon review of the detailed description set forth below.

BRIEF DESCRIPTION OF THE DRAWINGS

The invention is better understood by reading the following detailed description of the invention in conjunction with the accompanying drawings.

DETAILED DESCRIPTION OF THE INVENTION

The following description of the present invention is provided as an enabling teaching of the invention in its best, currently known embodiment. Those skilled in the relevant art will recognize that changes can be made to the embodiments described, while still obtaining the beneficial results of the present invention. Accordingly, those who work in the art will recognize that modifications and adaptations to the present invention are possible and may even be desirable in certain circumstances, and are a part of the present invention. Thus, the following description is provided as illustrative of the principles of the present invention and not in limitation thereof since the scope of the present invention is defined by the claims.

Figure 1:
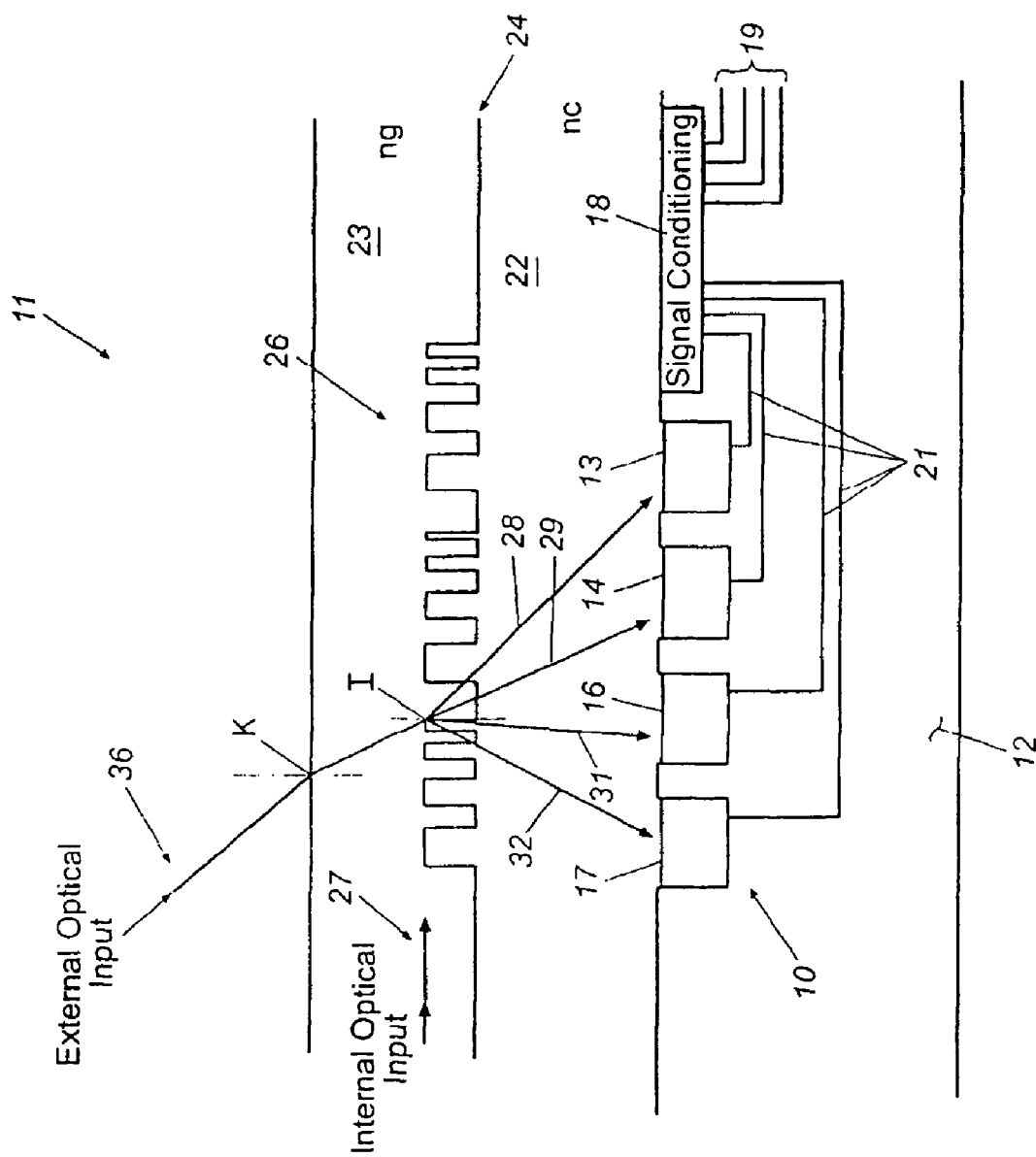
FIG. 1 illustrates a simplified cross-sectional view of an integrated optical multiplexer that embodies principles of the present invention in a preferred form.

Referring now in more detail to the drawing, FIG. 1 illustrates an integrated optical demultiplexer that embodies principles of the invention in a preferred form. It will be understood that the figure includes only the very small section of a micro-electronic integrated circuit that is dedicated to optical demultiplexing and that the complete chip, which may be a microprocessor, may contain millions of integrated electronic components or features not visible in the small section of FIG. 1.

The integrated optical demultiplexer 11 is formed on an integrated circuit substrate 12, which, conventionally, may be formed of an N type silicon material. Portions of the substrate 12 not visible in FIG. 1 may be etched and doped by traditional integrated circuit fabricating techniques to support millions of electronic features or components that together form, for example, a microprocessor or other electronic device. An array of optical or photo detectors (indicated by reference numeral 10 in FIG. 1) are formed on the substrate 12 by traditional integrated circuit fabricating techniques and may, for example, be comprised of a P$^+$ type doping with appropriate impurities to render the detectors sensitive to light. (Of course, the substrate may be a P type material and the sensors may be an N type material if desired). In the illustrated embodiment, an array of four spaced apart photo detectors made up of a first detector 13, a second detector 14, a third detector 16, and a fourth detector 17 are formed on the substrate. It will be understood, however, that more or fewer than four photo detectors may be formed on the substrate depending on the number of channels of optically transmitted data that are to be received at the location of the sensor array. The array, for instance, might comprise 80 detectors if 80 channels of optical data is to be transmitted. The fabrication of photo detectors on an integrated circuit substrate by appropriate etching, doping, and other techniques is known by those skilled in the art of integrated circuit manufacturing and thus need not be described in detail here.

Signal conditioning electronics 18 are formed on the integrated circuit substrate 12 adjacent the photo detector array 10 and these electronics are electrically coupled to each of the photo detectors in the array by appropriate conductors 21, also formed on or in the integrated circuit substrate 12. The signal conditioning electronics are designed to receive electrical signals produced by the photo detectors 13, 14, 16, and 17 when they are illuminated with a light beam. Characteristically, these electrical signals exhibit spatial and temporal characteristics of the incident light beam including modulations of the light beam that carry data or other information carried by and transmitted with the beam. The signal conditioning electronics 18 performs several functions including, but not limited to, filtering functions to reduce cross-talk between the photo detectors of the array 10, demodulation of the signals from the photo detectors to extract the data from the optical frequency carrier wave, and formatting of the data into a conventional format for subsequent transmission via electrical outputs 19 to other electronic components on the integrated circuit chip.

A first layer of optically transparent (at least at wavelengths of interest) material 22 is formed on the substrate 12 covering and overlying the photo detector array 10. The first layer of optically transparent material has a first index of refraction designated nc in the drawing. The first layer of transparent material 22 may be selected from any of a number of appropriate materials having different indices of refraction including, without limitation, a low K polymer (index of refraction between about 1.2 and 1.3), air or another gas (index of refraction equal to about 1), or silica (index of refraction equal to about 1.5).

A second layer of optically transparent (at least at wavelengths of interest) material 23 is formed on the first layer of optically transparent material 22 and has a second index of refraction designated ng in the drawing. The material from which the second layer of optically transparent material is formed may be selected from any of a number of appropriate materials including, without limitation, LiNbO3 (index of refraction equal to about 2.1), Silicon Nitride (index of refraction equal to about 2), silica (index of refraction equal to about 1.5), a polymer (index of refraction equal to about 1.5 to 1.6), a polysilicon (index of refraction equal to about 4) or silicon (index of refraction equal to about 3.8). Materials with higher indices of refraction allow for a thinner waveguide because of the greater refraction of light through such materials. In application, the materials of the first and second layers of optically transparent materials 22 and 23 are selected such that the corresponding indices of refraction of the two layers are different. An interface 24 is formed between and at the junction of the first and second layers of optically transparent materials 22 and 23. The second layer of optically transparent material 23 forms a waveguide for the transmission of optical signals as discussed in more detail below.

A binary blazed grating 26 is formed at the interface between the first and second layers of optically transparent material according to the principles discussed in detail in the references co-authored by the inventor and incorporated herein by reference above. The grating may be etched, stamped, or otherwise formed on the second layer of optically transparent material if desired, but, more preferably, is formed on the surface of the first layer 22 prior to depositing the second layer 23 thereon. The binary blazed grating 26 essentially forms a waveguide coupler between the waveguide formed by the second layer of optically transparent material 23 and the first layer of optically transparent material 22.

Operation of the optical demultiplexer 11 will now be described in the context of two alternative modes of operation, each of which is equally applicable. First, an internal optical input 27 is transmitted through the waveguide formed by the second layer of material 23 from a remote location on the chip. The optical input comprises a wavelength division multiplexed light beam that is made up, in the illustrated embodiment, of four discrete wavelength light beams combined together into a polychromatic beam. It will be understood that the optical input 27 may be made up of less or more than four discrete wavelength beams if desired depending upon the number of channels of information to be transmitted with the beam. Each of the discrete wavelength light beams has a fundamental frequency that is modulated with data such that the data is encoded in and is transmitted with the multiplexed beam as is known in the art. Thus, in the illustrated embodiment, four channels of data may be transmitted simultaneously with the multiplexed optical input beam 27.

As the wavelength division multiplexed optical input beam 27 encounters the binary blazed grating 26 at I in FIG. 1, the binary blazed grating 26 functions as described above to diffract the beam into the first layer of optically transparent material 22. Since each of the beams that make up the multiplexed beam has a different discrete wavelength, each beam is diffracted at a different angle with respect to a normal to the interface between the two layers as shown. The angles at which the beams are diffracted are a function of the wavelengths of the beams, the construction of the binary blazed grating, and the relative indices of refraction of the materials of the first and second layers of optically transparent material 22 and 23.

In the illustrated embodiment, the diffraction of the discrete wavelength components of the multiplexed beam results in a fanning out of the discrete wavelength beams to separate them into a first, second, third, and fourth discrete wavelength beams 28, 29, 31, and 32 respectively. Thus, the multiplexed beam is demultiplexed or separated into its component beams by the binary blazed grating. Each of the separated beams travels through the first layer of optically transparent material 22 toward a location on the integrated circuit substrate 12. The photo detectors 13, 24, 16, and 17 are arrayed on the substrate such that each one of the photo detectors is positioned to intercept a corresponding one of the demultiplexed light beams as shown. When illuminated by an incident beam, each of the detectors produces an electrical signal having the temporal and spatial characteristics of the beam. Thus, the electrical signal produced includes a carrier at the fundamental wavelength of the beam and the modulations that represent the data modulated or encoded onto the beam. These electrical signals, then, are received by the signal conditioning electronics, filtered, demodulated to extract the data therefrom, and the data is appropriately formatted for communication with other electronic elements on the integrated circuit through electrical outputs 19. Thus, it will be seen that, in the illustrated embodiment, four discrete channels of data are optically transmitted simultaneously, demultiplexed, demodulated, and formatted for subsequent communication with other electronic devices.

The second mode of operation is similar to the first mode just described except that the wavelength division multiplexed optical input 37 enters the second layer of optically transparent material 23 from outside the second layer rather than being transmitted through the waveguide formed by the second layer. In FIG. 1, the optical input 37 enters the second layer from free space. However, it will be understood that a material other than free space may overlie the second layer and the beam may enter the waveguide from this material rather than from free space. In any event, in this mode of operation, the optical input may originate not at a different location on the integrated circuit chip but at a different chip on a circuit board. Alternatively, the optical input may be an optical signal originating from a remote geographic location and transmitted by optical fiber to the chip that embodies the demultiplexer of the present invention. In this regard, the present invention has application to receiving and demultiplexing optical telecommunications signals as well as to on-chip optical interconnections. In fact, optical telecommunications and optical data signals may be transmitted simultaneously and either or both may be transmitted through the waveguide formed by the second layer of material and/or from outside this waveguide.

As the multiplexed optical input 36 enters the second layer of optically transparent material 23 at K in FIG. 1, it is refracted a bit and travels through the second layer to the binary blazed grating 26. Just as with the internal optical input 27, the binary blazed grating demultiplexes the optical input, separating it into its discrete wavelength component beams 28, 29, 31, and 32. These beams are then intercepted by the photo detectors of array 10 and the data carried by the beams extracted and properly formatted by the signal conditioning electronics 18.

There are two new major techniques involved in the integrated optical demultiplexer manufacturing process: (1) fabrication of the photo detector array and (2) fabrication of the binary blazed grating, all in a CMOS compatible fashion.

Figure 2:
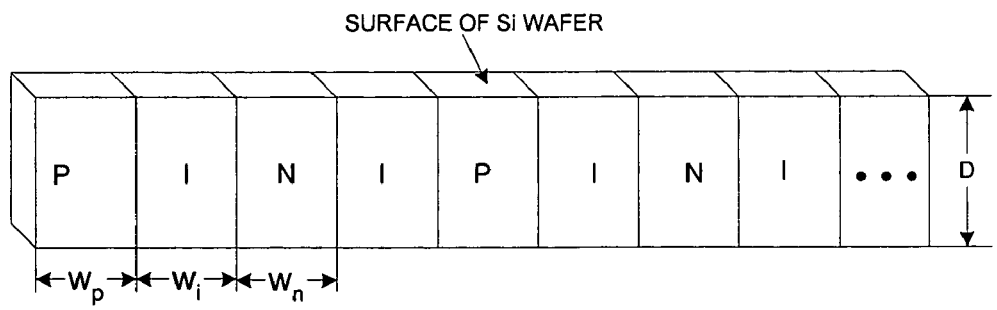
FIG. 2 illustrates an exemplary "P-I-N" structure for photo detector design.
Figure 3:
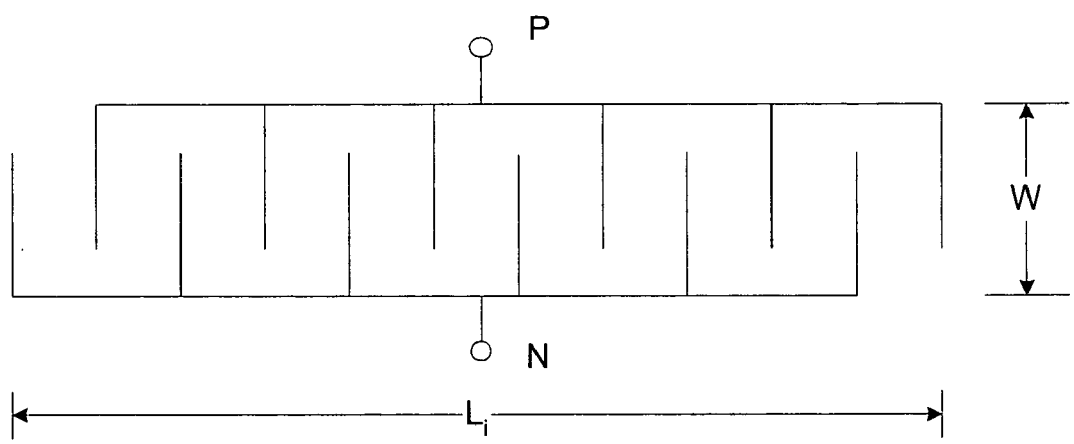
FIG. 3 illustrates an exemplary embodiment of the electrodes on the surface of a silicon wafer in interdigitated form for connecting photo detectors.

To maximize the responsivity and the bandwidth, and minimize the surface footprint of the photo detector array (PDA), a lateral silicon P-I-N structure is arranged as shown in FIG. 2. D, $W_p$, $W_i$, $W_n$ are determined through a detailed photo detector design according to different intended applications. As illustrated in FIG. 3, the electrodes on the surface of the silicon wafer to connect the photo detectors may be in an "interdigitated" form. The width "W" is fixed, but "$L_i$" will depend on the individual photo detector. Normally, "$L_i$" will increase as the "i" increases.

Figure 4:
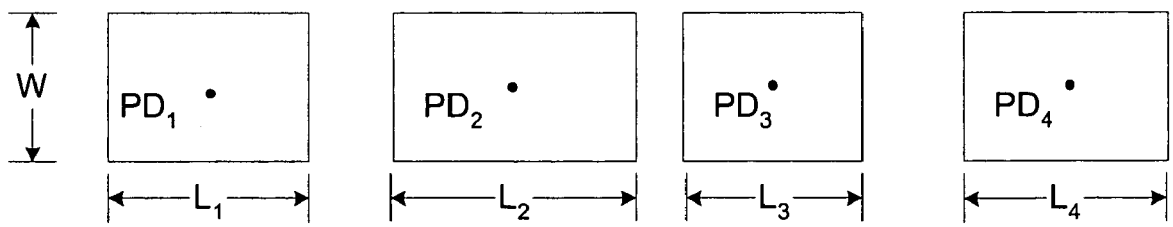
FIG. 4 illustrates an exemplary one-dimensional photo detector array in accordance with an embodiment of the invention.

The photo detector array could be a two-dimensional array, however, in one exemplary embodiment a one dimensional array is designed. The main concern is to calculate the $L_i$ according to the output optical field pattern from the binary blazed grating, and the center location of $PD_i$, as illustrated in FIG. 4.

Figure 5A:
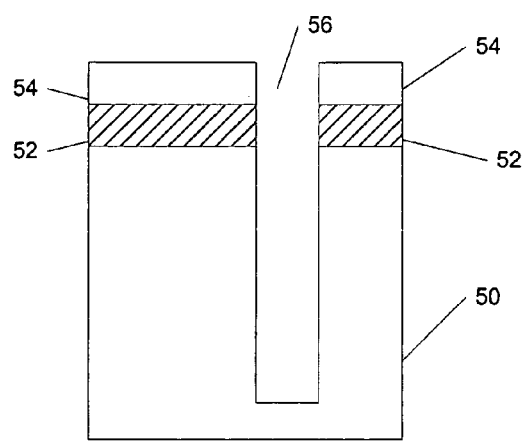
FIGS. 5A–5E illustrate an exemplary step-by-step process for the fabrication of photo detectors.
Figure 5B:
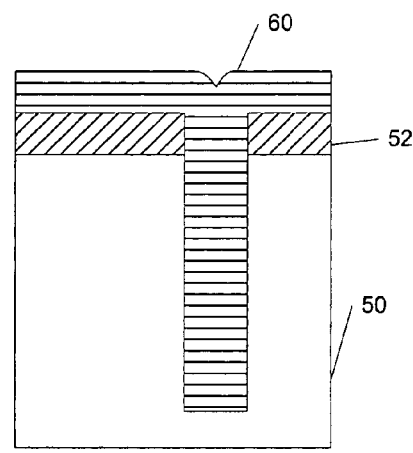

FIGS. 5A–5E illustrate the steps in the fabrication process for the photo detector PDi. It starts with a silicon wafer 50 with a silicon dioxide ($SiO_2$) layer 52 and a light sensitive photoresist material 54 on top. The photoresist 54 is exposed through a mask with high intensity ultraviolet light wherever silicon dioxide 52 is to be removed. On top of the "N" regions, the SiO$_2$ layers are removed via lithography and etching. The silicon area exposed is then etched by inductive coupled plasma (ICP) to form a deep trench 56 as illustrated in FIG. 5A A low-pressure chemical vapor deposition (LPCVD) process is then used to fill the trench 56 with N type doped polysilicon 60 as shown in FIG. 5B. The N type polysilicon 60 on top of the SiO$_2$ 52 is then etched away using ICP, reactive-ion etching (RIE), or chemical mechanical polishing (CMP). A photoresist material 64 is added to the resulting structure.

Figure 5C:
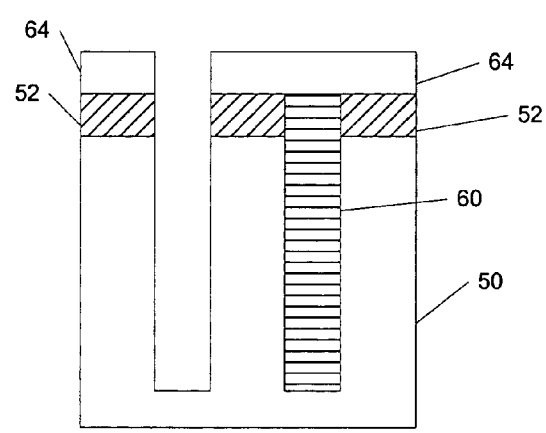
Figure 5D:
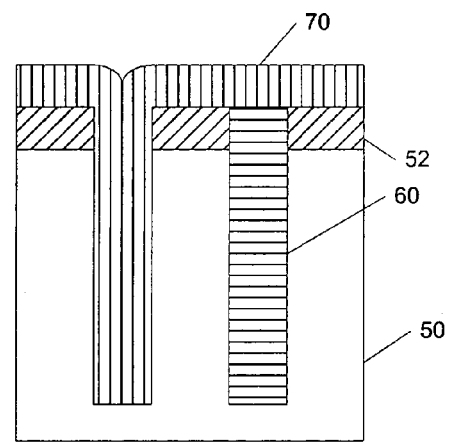
Figure 5E:
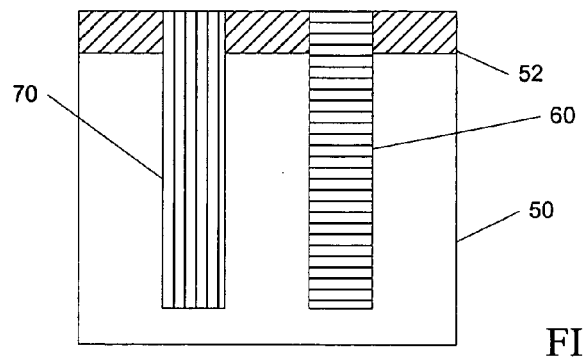

The SiO$_2$ layers 52 are removed on top of the "P" regions using lithography and etching and the exposed silicon area is etched using ICP to form a deep trench 58 resulting in the structure shown in FIG. 5C. An LPCVD process is then used to fill "p" region deep trenches 58 with "P" type doped polysilicon 70 as shown in FIG. 5D. The P type polysilicon 70 on top of the SiO$_2$ 52 is then etched away using ICP, reactive-ion etching (RIE), or chemical mechanical polishing (CMP) to form the structure illustrated in FIG. 5E. The wafer is then annealed to form the final p-i-n structure. At this point in the manufacturing process, the signal conditioning circuits are fabricated using a standard Complementary Metal Oxide Semiconductor (CMOS) process. The interdigitated electrodes illustrated in FIG. 3 are placed on top of the photo detector PD$_i$ during the signal conditioning circuit fabrication process.

Figure 6A:
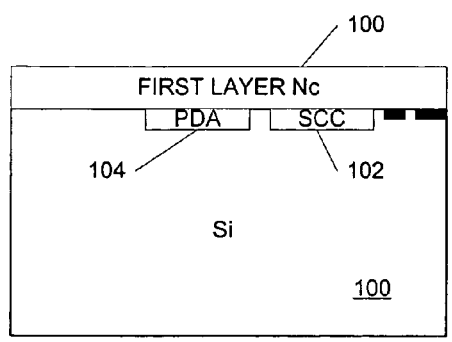
FIGS. 6A–6F illustrate an exemplary step-by-step process for the fabrication of the binary blazed grating.
Figure 6B:
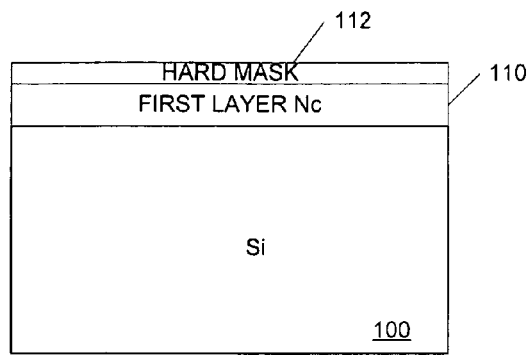
Figure 6C:
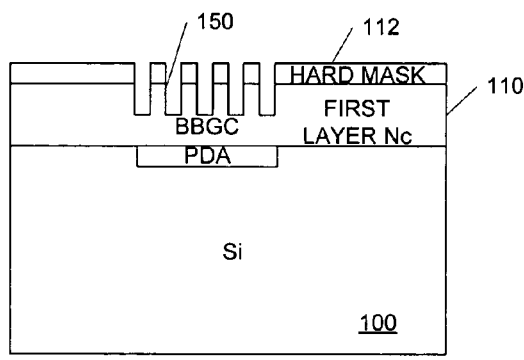

FIGS. 6A–6F illustrate the steps in the fabrication of the binary blazed grating coupler (BBGC) 150. Although the process is described in the context of the fabrication of a single binary blazed grating, this is not a limitation and multiple binary blazed gratings can be fabricated on a single silicon chip. After the signal conditioning circuits 102 are fabricated, the silicon 100 surface is cleaned and planarized for binary blazed grating fabrication over the photo detector array 104. As illustrated in FIG. 6A, the first step is to coat a first layer of optical material 110 on the silicon 100, the optical material 110 having an index of refraction Nc. The thickness of the optical layer is determined by the specific application. A hard mask 112, designed through a binary blazed grating simulation, is patterned on top of the first layer of optical material 110 as shown in FIG. 6B. Part of the exposed first layer 110 is then etched by ICP as shown in FIG. 6C. The hard mask 112 is then removed.

Figure 6D:
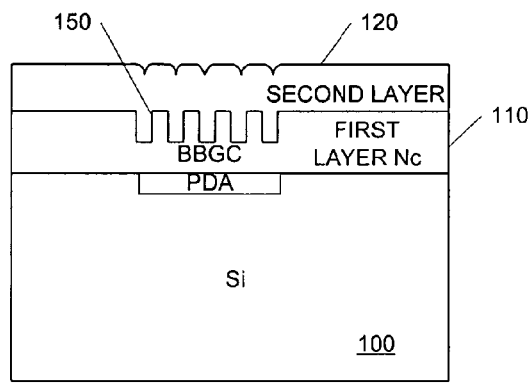
Figure 6E:
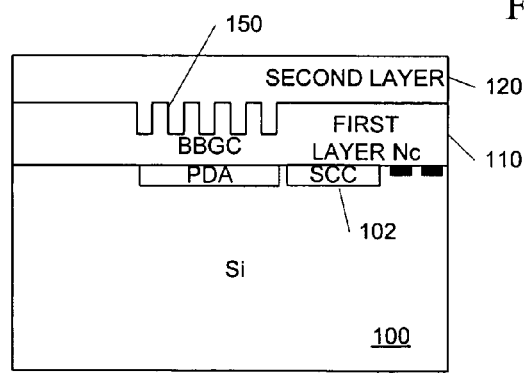
Figure 6F:
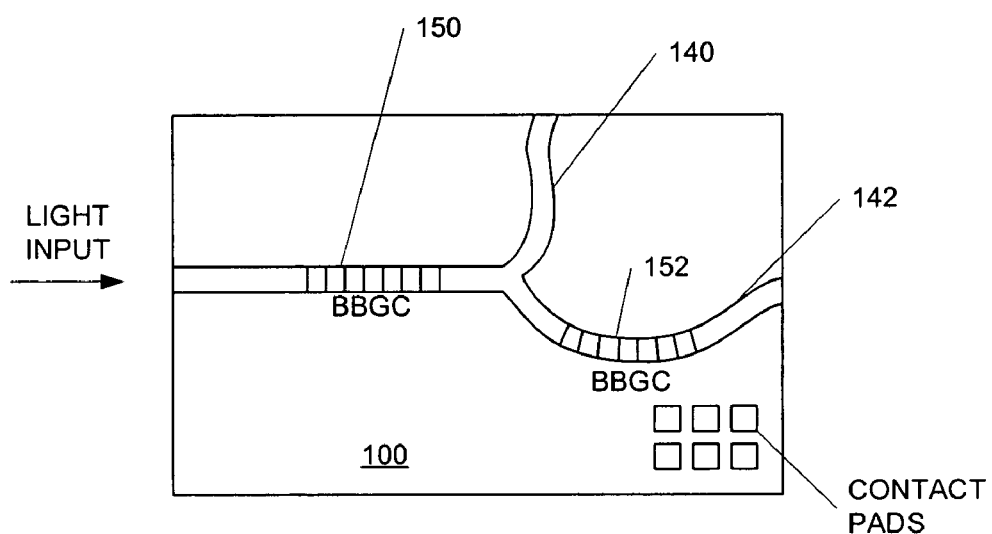

As illustrated in FIG. 6D, a second layer of optical material 120 is then deposited, using LPCVD technology, on top of the first layer 110 to a certain thickness. The thickness of the second layer 120 is thicker than that needed to obtain a proper waveguiding capability for the working wavelength. The second layer 120 is then planarized using a CMP process as shown in the cross-section view of FIG. 6E. The proper waveguide formation is fabricated using conventional planar light circuit (PLC) technology to manipulate the path 140, 142 of the optic light. This is illustrated in the top view of FIG. 6F. This figure also shows a second binary blazed grating 152 along optic path 142. A proper contact cut to expose the contact pads of the signal conditioning circuits is then formed by lithography and ICP etch, as shown in FIG. 6F, so that a metal connection will be made to output the electrical signals.

Optical systems generally are reversible by nature. Thus, the present invention also contemplates an optical multiplexer for multiplexing data modulated discrete wavelength optical beams into a polychromatic beam for transmission. In the case of optical interconnects on an integrated circuit chip, optical multiplexers may be formed on the chip at locations where data originates and demultiplexers, as described above, may be formed where the data is to be received. The present invention formed as a multiplexer is configured similarly to the demultiplexer of FIG. 1, except that the photo detectors are replaced by photo and preferably laser emitters adapted to emit rather than respond to discrete wavelength light beams. In this regard, many types of laser emitters may be employed such as, for example, Vertical Cavity Surface Emitting Lasers (VCSELs) as well as edge emitting lasers and others. The invention is intended to encompass any type of optical signal generating device, whether now known or hereafter discovered. Integrated circuit substrate compounds appropriate for forming integrated laser emitters include, but are not limited to, GaAs, InP, InGaAs, and InGlGaAs. Generally, techniques for forming laser emitters on an integrated circuit substrate are known in the integrated circuit art and thus need not be discussed in detail here.

In a multiplexer configuration, the signal conditioning electronics receives data at electrical inputs, formats the data for modulation, and produces modulated electrical signals that are applied to the laser emitters. The emitters, in turn, emit discrete wavelength beams that travel through the first layer of optically transparent material and are combined or multiplexed into a wavelength division multiplexed beam by the binary blazed grating. The multiplexed beam is then transmitted through the waveguide formed by the second layer of optically transmitted material and is available for demultiplexing at a demultiplexing location. In this way, complete on-chip optical data and/or telecommunications interconnects are formed and data is transmitted optically rather than electrically, with all the attendant advantages discussed above. The resulting multiplexed beam may also be transmitted into free space for subsequent transmission to other chips or to a remote geographic location through traditional fiber optic cables.

The integrated optical demultiplexer and/or multiplexer of the present invention is possible through use of the binary blazed grating, which, as discussed above, may be fabricated on micro- or nano-scales for incorporation into integrated circuit chips while still retaining its ability to allocate virtually all of the power of an incident light beam into a selected diffractive order. This simply is not possible with regular blazed gratings or other types of diffraction gratings that simulate them.

The invention has been described in terms of preferred embodiments and methodologies. It will be understood by those of skill in the art, however, that many additions, deletions, and modifications may be made to the illustrated embodiments within the scope of the invention. For instance, in its simplest form, the invention might be configured merely as an optical signal detector or switch, in which case the input beams might be of only a single wavelength with a single detector to detect the presence of a beam. Alternatively, a single wavelength beam could be used to encode data in serial fashion rather than modulating the carrier frequency of the input beam to encode data. Finally, materials other than those suggested might also be chosen for the substrate and the layers of optically transparent material, and all appropriate materials are considered to be equivalent to those disclosed above. These and other modifications might be made by those of skill in the art without departing from the spirit and scope of the invention as set forth in the claims.

What is claimed is:

1. A method for manufacturing an optical demultiplexer on an integrated circuit substrate for wavelength division transmission of information, comprising:

fabricating an array of optical detectors on the substrate based on a predetermined optical detector design analysis;
fabricating a signal conditioning circuit on the substrate adjacent to the array of optical detectors and coupling the signal conditioning circuit to the array of optical detectors;
forming a first layer of optically transparent material on the substrate covering the array of optical detectors and signal conditioning circuit;
fabricating a binary blazed grating on the first layer of optically transparent material; and
forming a second layer of optically transparent material over the first layer and binary blazed grating to form an optical waveguide for diffracting incident light.

2. The method for manufacturing an optical demultiplexer of claim 1 wherein a thickness of the first layer of optically transparent material is determined based on a specific application for the optical demultiplexer.

3. The method for manufacturing an optical demultiplexer of claim 1 wherein the array of optical detectors is formed on a silicon P-I-N structure.

4. The method for manufacturing an optical demultiplexer of claim 3 wherein the array of optical detectors is formed by removing a silicon dioxide layer from the "N" regions of the substrate, forming a trench in the "N" regions and filling the trench with "N" type doped polysilicon.

5. The method for manufacturing an optical demultiplexer of claim 4 wherein the step of forming a trench in the "N" regions is performed via inductive coupled plasma etching.

6. The method for manufacturing an optical demultiplexer of claim 4 wherein the step of filling the trench with "N" type doped polysilicon is performed via a low-pressure chemical vapor deposition process.

7. The method for manufacturing an optical demultiplexer of claim 6 further comprising the step of removing "N" type doped polysilicon from the silicon dioxide layer.

8. The method for manufacturing an optical demultiplexer of claim 3 wherein the array of optical detectors is formed by removing a silicon dioxide layer from the "P" regions of the substrate, forming a trench in the "P" regions and filling the trench with "P" type doped polsilicon.

9. The method for manufacturing an optical demultiplexer of claim 8 wherein the step of forming a trench in the "P" regions is performed via inductive coupled plasma etching.

10. The method for manufacturing an optical demultiplexer of claim 8 wherein the step of filling the trench with "P" type doped polysilicon is performed via a low-pressure chemical vapor deposition process.

11. The method for manufacturing an optical demultiplexer of claim 10 further comprising the step of removing "P" type doped polysilicon from the silicon dioxide layer.

12. The method for manufacturing an optical demultiplexer of claim 1 wherein a length for each optical detector is determined based on a predetermined output optical pattern from the binary blazed grating.

13. The method for manufacturing an optical demultiplexer of claim 1 wherein the step of forming a first layer of optically transparent material comprises depositing a material having a low index of refraction on the substrate and the array of optical detectors formed on the substrate.

14. The method for manufacturing an optical demultiplexer of claim 13 wherein the deposited material is selected from a group consisting of a polymer or silica.

15. The method for manufacturing an optical demultiplexer of claim 13 wherein the deposited material has an index of refraction from about 1.0 to about 2.0.

16. The method for manufacturing an optical demultiplexer of claim 1 wherein the step of forming a second layer of optically transparent material comprises depositing a material having an index of refraction that is greater than the index of refraction of the first layer of optically transparent material.

17. The method for manufacturing an optical demultiplexer of claim 16 wherein the deposited material is selected from a group consisting of silicon nitride, a polymer, silica, silicon, polysilicon or LiNbO3.

18. The method for manufacturing an optical demultiplexer of claim 1 wherein the step of forming a second layer of optically transparent material comprises depositing a material having an index of refraction that is different from the index of refraction of the first layer of optically transparent material.

19. The method for manufacturing an optical demultiplexer of claim 1 wherein the incident light comprises a plurality of beams each having a different and discrete wavelength.

20. The method for manufacturing an optical multiplexer of claim 19 wherein the step of forming a second layer of optically transparent material comprises depositing a material having an index of refraction that is greater than the index of refraction of the first layer of optically transparent material.

21. The method for manufacturing an optical demultiplexer of claim 1 wherein the incident light originates from a device on the integrated circuit substrate.

22. The method for manufacturing an optical demultiplexer of claim 1 wherein the incident light originates from outside the integrated circuit substrate.

23. The method for manufacturing an optical demultiplexer of claim 1 wherein the binary blazed grating diffracts the incident light into a plurality of component beams of discrete wavelengths that are intercepted by a corresponding optical detector in the array of optical detectors.

24. The method for manufacturing an optical demultiplexer of claim 1 wherein the binary blazed grating comprises a plurality of ridges and a plurality of troughs, the width and the spacing of the ridges and troughs being varied during fabrication to provide a plurality of localized sub-wavelength, submicrometer grating features within a grating period.

25. The method for manufacturing an optical demultiplexer of claim 1 wherein the step of fabricating a binary blazed grating on the first layer comprises the steps of designing a hard mask for the binary blazed grating through a simulation.

26. The method for manufacturing an optical demultiplexer of claim 25 wherein the step of fabricating a binary blazed grating further comprises patterning the hard mask on the first layer of optically transparent material and etching the binary blazed grating.

27. The method for manufacturing an optical demultiplexer of claim 1 wherein the step of forming a second layer of optically transparent material is performed via a low-pressure chemical vapor deposition.

28. The method for manufacturing an optical demultiplexer of claim 1 further comprising the step of planarizing the second layer of optically transparent material.

29. The method for manufacturing an optical demultiplexer of claim 1 further comprising forming the optical waveguide using a conventional planar light circuit process to manipulate the path of the incident light.

30. The method for manufacturing an optical demultiplexer of claim 1 further comprising exposing a plurality of contact pads of the signal conditioning circuit via lithography and etching.

31. The method for manufacturing an optical demultiplexer of claim 1 further comprising placing interdigitated electrodes on each optical detector during fabrication of the signal conditioning circuit.

32. A method for manufacturing an optical multiplexer on an integrated circuit substrate for combining light beams of discrete wavelengths into a single polychromatic beam for wavelength division transmission of information, comprising:

positioning an array of optical emitters on the substrate;

fabricating a signal conditioning circuit on the substrate adjacent to the array of optical emitters and coupling the signal conditioning circuit to the array of optical emitters;

forming a first layer of optically transparent material on the substrate covering the array of optical emitters and signal conditioning circuit;

fabricating a binary blazed grating on the first layer of optically transparent material; and forming a second layer of optically transparent material over the first layer and binary blazed grating to form an optical waveguide for intercepting light beams of discrete wavelengths and combining the intercepted light beams into a polychromatic light beam for transmission through the optical waveguide.

33. The method for manufacturing an optical multiplexer of claim 32 wherein the step of forming a first layer of optically transparent material comprises depositing a material having a low index of refraction on the substrate and the array of optical emitters formed on the substrate.

34. The method for manufacturing an optical multiplexer of claim 32 wherein the deposited material is selected from a group consisting of a polymer or silica.

35. The method for manufacturing an optical multiplexer of claim 32 wherein the step of forming a second layer of optically transparent material comprises depositing a material having an index of refraction that is different from the index of refraction of the first layer.

36. The method for manufacturing an optical multiplexer of claim 32 wherein the deposited material is selected from a group consisting of silicon nitride, a polymer, silica, silicon, polysilicon or LiNbO3.

37. The method for manufacturing an optical multiplexer of claim 32 further comprising fabricating the binary blazed grating on the first layer of optically transparent material.

38. The method for manufacturing an optical multiplexer of claim 32 further comprising fabricating the binary blazed grating on the second layer of optically transparent material.

* * * * *